(12) United States Patent
Wilhelmsson et al.

(10) Patent No.: US 11,394,416 B2
(45) Date of Patent: *Jul. 19, 2022

(54) RADIO RECEIVER, METHOD AND COMPUTER PROGRAM

(71) Applicant: Telefonaktiebolaget LM Ericsson (publ), Stockholm (SE)

(72) Inventors: Leif Wilhelmsson, Lund (SE); Miguel Lopez, Solna (SE); Henrik Sjöland, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 17/178,685

(22) Filed: Feb. 18, 2021

(65) Prior Publication Data

US 2021/0175918 A1    Jun. 10, 2021

Related U.S. Application Data

(63) Continuation of application No. 16/488,390, filed as application No. PCT/EP2017/067568 on Jul. 12, 2017, now Pat. No. 10,998,928.

(Continued)

(51) Int. Cl.
*H04B 1/30* (2006.01)
*H03D 7/16* (2006.01)
*H04W 52/02* (2009.01)

(52) U.S. Cl.
CPC .......... *H04B 1/30* (2013.01); *H03D 7/165* (2013.01); *H04W 52/0229* (2013.01); *H04W 52/0235* (2013.01); *H04W 52/0238* (2013.01)

(58) Field of Classification Search
CPC .......... H04B 1/28; H04B 1/30; H04B 1/1036; H04B 17/318; H04W 52/0229; H04W 52/0238; H04W 52/0235; H03D 7/165
See application file for complete search history.

(56) References Cited

U.S. PATENT DOCUMENTS 5,193,210 A    3/1993 Nicholas et al.
2003/0089843 A1    5/2003 Sayyah et al.
(Continued)

FOREIGN PATENT DOCUMENTS

CN    1290430 A    4/2001
CN    1984169 A    6/2007
(Continued)

OTHER PUBLICATIONS

Japanese Office Action and English Summary dated Oct. 2, 2020 issued for Application No. 2019-543988 consisting of 5-pages.
(Continued)

*Primary Examiner* — Thanh C Le
(74) *Attorney, Agent, or Firm* — Christopher & Weisberg, P.A.

(57) ABSTRACT

A radio receiver comprises a local oscillator arrangement and a controller. The local oscillator arrangement is arranged to provide a signal for down-conversion of radio frequency signal to an intermediate frequency or a baseband frequency in the radio receiver, and the local oscillator arrangement is capable of selectably providing multiple frequency generation qualities. The controller is arranged to estimate a tolerable frequency generation quality for the current operation of the radio receiver or determine whether the current operation of the radio receiver is satisfactory in sense of a currently provided frequency generation quality, and based on the estimation or determination adjust frequency generation quality of the local oscillator arrangement by selecting one of the multiple frequency generation qualities. A radio arrangement, a method and a computer program are also disclosed.

21 Claims, 2 Drawing Sheets

Related U.S. Application Data

(60) Provisional application No. 62/470,467, filed on Mar. 13, 2017.

(56) References Cited

U.S. PATENT DOCUMENTS

| | | | |
|---|---|---|---|
| 2003/0224747 | A1 | 12/2003 | Anand |
| 2004/0018824 | A1* | 1/2004 | Fang ................... H04B 1/109 455/313 |
| 2004/0266376 | A1 | 12/2004 | Cowley et al. |
| 2006/0025099 | A1 | 2/2006 | Jung et al. |
| 2006/0189288 | A1 | 8/2006 | Jin et al. |
| 2009/0081961 | A1 | 3/2009 | Rofougaran |
| 2009/0197554 | A1 | 8/2009 | Shi et al. |
| 2010/0330919 | A1* | 12/2010 | Gurney ................. H04W 16/14 455/67.11 |
| 2013/0154693 | A1* | 6/2013 | Moeglein ............. H04W 4/029 327/143 |
| 2014/0009236 | A1 | 1/2014 | Choi et al. |
| 2014/0113576 | A1 | 4/2014 | Nentwig et al. |
| 2018/0074461 | A1* | 3/2018 | Matsue ................. G04R 20/02 |
| 2018/0234979 | A1* | 8/2018 | Sundström ............ H04B 15/06 |
| 2021/0336437 | A1* | 10/2021 | Jiang ......................... H02J 3/24 |
| 2021/0352598 | A1* | 11/2021 | Raza ................. H04W 56/0035 |

FOREIGN PATENT DOCUMENTS

| | | |
|---|---|---|
| CN | 101827431 A | 9/2010 |
| CN | 101953078 A | 1/2011 |
| CN | 204068947 U | 12/2014 |
| CN | 106416102 A | 2/2017 |
| JP | 2010147622 A | 7/2010 |
| KR | 2000-0006905 | 2/2000 |
| KR | 10-2013-0013785 | 2/2013 |
| WO | 2015180937 A1 | 12/2015 |

OTHER PUBLICATIONS

Chinese Office Action with English Translation dated Nov. 3, 2020 issued for Application No. 201780088082.1 consisting of 12-pages.

Korean Office Action and English Translation dated Dec. 22, 2020 for Application No. 10-2019-7026816, consisting of 5-pages.

International Search Report and Written Opinion dated Jan. 2, 2018 for International Application No. PCT/EP2017/067568 filed on Jul. 12, 2017, consisting of 15-pages.

Malinowski et al. "CargoNet: A Low-Cost MicroPower Sensor Node Exploiting Quasi-Passive Wakeup for Adaptive Asychronous Monitoring of Exceptional Events" MIT Media Lab, Responsive Environments Group, Cambridge Massachusetts, Nov. 6-9, 2007, consisting of 15-pages.

IEEE Standard Definitions of Physical Quantities for Fundamental Frequency and Time Metrology—Random Instabilities; IEEE Standards Coordinating Committee 27; Feb. 27, 2009, consisting of 45-pages.

IEEE 802.11-17/0094r1; Concurrent transmission of data and a wake-up signal in 802.11ax; Jan. 15, 2017, consisting of 11-pages.

IEEE 802.11-17/0026r0; WUR Phase Noise Model Study; Jan. 10, 2017, consisting of 12-pages.

Korean Office Action and English Translation dated Jun. 10, 2020 for Application No. 10-2019-7026816, consisting of 11-pages.

Indian Examination Report dated Oct. 1, 2021 for Application No. 201947035909, consisting of 9 pages.

* cited by examiner

RADIO RECEIVER, METHOD AND COMPUTER PROGRAM

CROSS-REFERENCE TO RELATED APPLICATIONS

This application is a Continuation of U.S. application Ser. No. 16/488,390, filed Aug. 23, 2019, which is a National Stage Application for PCT/EP2017/067568, filed Jul. 12, 2017, which claims priority to U.S. Provisional Application No. 62/470,467, filed Mar. 13, 2017, the entireties of which are incorporated herein by reference.

TECHNICAL FIELD

The present invention generally relates to a radio receiver, a method for a radio receiver, and a computer program for a controller of a radio receiver. In particular, the present invention relates to adjusting frequency generation quality of a local oscillator arrangement arranged to provide a frequency for down-conversion of radio frequency signal to an intermediate frequency or a baseband frequency in the radio receiver.

BACKGROUND

Internet of Things (IoT) is expected to increase the number of connected devices significantly. A vast majority of these devices will likely operate in unlicensed bands, in particular the 2.4 GHz ISM band. At the same time, there is also an increased demand for using the unlicensed bands also for services that traditionally have been supported in licensed bands. As an example of the latter, third generation partnership project (3GPP) that traditionally develop specifications only for licensed bands have now also developed versions of Long Term Evolution (LTE) which will operate in the 5 GHz unlicensed band.

A large number of these IoT devices are expected to be powered by coin-cell batteries, which means that energy consumption is of utmost importance. In the future, it may even be so that these devices will be able to harvest their energy themselves, potentially even further increasing the importance of low energy consumption.

For these kind of applications, the supported data rates are low, both concerning peak data rates and aggregated data rate during, say, an average day. This means that major part of the power is not consumed when the IoT device is transmitting or receiving data, but rather when the devices are listening to determine whether there might be a transmission for which it is the intended receiver.

The fact that such a large part of the total energy consumption is due to listening for a potential transmission, just to find out that the transmission is not there, has motived the development of so-called wake-up receivers (WUR), sometimes also referred to as wake-up radios. A WUR is a device which has extremely low power consumption and whose only purpose typically is to wake up the main transceiver. So, an IoT device with a WUR will not need to turn on the main receiver to scan for a potential packet, but will instead turn on the WUR. If in fact there is data for the IoT device, a wake-up signature (WUS) will be sent. When the WUR has decoded this WUS, and determined that there in fact is data present it will then wake up the main receiver and transmitter, and a communication link can be established. The potential of WURs has been recognized within the IEEE 802.11 standardization community. Specifically, the task group 802.11 TGba "Wake-up Radio Operation" has been chartered to define a physical layer and define modifications to the medium access control layer specifications to enable the operation of WURs.

Although the power consumption for WUR is very low, it also comes with some short-comings. The most pronounced one is that the performance typically is much worse than that of the main receiver, both concerning sensitivity and selectivity. That is, the range for a WUR is often considerably smaller than for the main receiver, although one can reduce the difference due to that the data rate for the WUS typically may be much lower than for the main signal used for actual data. The reduced selectivity comes from that it is difficult to generate a precise frequency reference, without using considerable power, which can be used for down-conversion of the signal, and therefore it is not feasible to have a narrow-band selectivity filter. This, in turn, means that interfering signals that are relatively far from the WUS in frequency can still degrade the WUR sensitivity significantly.

When a WUR is operated in e.g. an unlicensed band like the 2.4 GHz ISM band, there is an additional problem in that the WUS may be severely interfered. When the main interferers are relying on carrier sense multiple access with collision avoidance (CSMA/CA), a WUS signal may not be recognized unless very strong, and thus a device would initiate a transmission although a transmission intended for a WUR may already be ongoing. A solution for this is to pre-append the WUS with a preamble that legacy devices relying on CSMA/CA can detect. The preamble can then effectively inform the legacy devices for how long the channel will be occupied and the legacy devices will defer from access the channel during this time.

As briefly discussed above, a critical part when introducing WURs in a band that is also used for data transmission, and in particular when the channel access is based on CSMA/CA, is to ensure that the WUS is protected from interference.

The approach of transmitting a preamble before the actual WUS is an effective means to achieve this when it comes to interference in the same channel, so-called co-channel interference (CCI). However, when it comes to interference originating from a transmission in another channel, so-called adjacent channel interference (ACI), the transmission of a preamble will not help.

Normally, ACI is handled by attenuating the ACI significantly by means of filtering. However, because of the very relaxed requirements on frequency generation in a WUR, i.e. due to prioritizing low power consumption at design, phase noise of a used local oscillator may be at a much higher level and/or the frequency accuracy may be lower than for an ordinary receiver. In an ordinary receiver, the phase noise must typically be kept low and frequency accuracy sufficiently high not to degrade the demodulation of the desired signal. For a WUR, the WUS is often modulated using on-off keying (OOK), where phase noise has very little impact on the performance, and demands on frequency accuracy may be moderate. Although the phase noise does not directly impact the desired signal, it may cause ACI to fall in-band when the signal is down-converted. That is, the ACI will effectively become CCI, and then it cannot be removed by filtering. This phenomenon is called reciprocal mixing. When frequency accuracy is very low, the desired down-converted signal risks falling out of band of used filters, which may degrade or ruin detection.

Another problem related to ACI is the above-mentioned relaxed requirements on frequency generation. If these requirements are very relaxed, it may not even be possible to suppress the ACI at all by filtering, whereas in some cases there is no ACI and not having to design for it may significantly relax requirements on frequency generation, enabling reduced power consumption in these situations.

Thus, in existing solutions, because of reciprocal mixing it is not possible to effectively combine really low power consumption assuming very relaxed frequency generation, with the ability to handle potentially strong ACI.

SUMMARY

The invention is based on the inventors' understanding that by estimating what frequency generation quality can be tolerated without having any noticeable negative impact on the WUR performance, the frequency generation quality is adapted such that the WUR performance requirements are met, preferably only with a small margin to still keep the power consumption of the WUR low. Thus, once the requirements on the phase noise are determined, the frequency generation quality is adapted in a suitable way, for example by using two or more local oscillator (LO) generation circuits with different properties, and select which one to use depending on the requirements, or by changing the characteristics of a single LO generation circuit, e.g. by spending different amounts of energy to keep frequency generation quality within desired bounds, or possibly a combination of both.

According to a first aspect, there is provided a radio receiver comprising a local oscillator arrangement and a controller. The local oscillator arrangement is arranged to provide a signal for down-conversion of radio frequency signal to an intermediate frequency or a baseband frequency in the radio receiver. The local oscillator arrangement is capable of selectably providing multiple frequency generation qualities. The controller is arranged to estimate a tolerable frequency generation quality for the current operation of the radio receiver or determine whether the current operation of the radio receiver is satisfactory in sense of a currently provided frequency generation quality, and based on the estimation or determination adjust frequency generation quality of the local oscillator arrangement by selecting one of the multiple frequency generation qualities.

The local oscillator arrangement may comprise multiple local oscillator generation circuits where the selection of one of the multiple frequency generation qualities includes selection of one of the local oscillator generation circuits. Each of the local oscillator generation circuits may be associated with a power consumption for the respective selected frequency generation quality. A local oscillator generation circuit of the local oscillator arrangement may be capable of selectably providing multiple frequency generation qualities by applying selectable circuit configuration for the local oscillator generation circuit. The selectable circuit configuration may comprise selectable operation parameters and/or selectable circuit parameters for the local oscillator generation circuit. The selectable operating parameters may comprise biasing of the local oscillator generation circuit. The selectable circuit parameters may comprise selectable impedances and/or selectable active circuit elements. The selectable impedances may comprise selectable inductors and selectable capacitors which may be selectably connectable to the local oscillator generation circuit. The selectable active circuit elements may comprise selectable transistors and/or amplifiers which may be selectably connectable to the local oscillator generation circuit.

At least one of the multiple local oscillator generation circuits may be capable of selectably providing multiple frequency generation qualities.

The radio receiver may be arranged to operate as a wake-up radio receiver for a main receiver interacting with the radio receiver. The estimation of the tolerable frequency generation quality may include reception of an indication from the main receiver with information about an interfering signal in an adjacent radio channel. The estimation may include that the radio receiver is arranged to periodically cause the main receiver to tune to an adjacent channel that may cause reciprocal mixing and to provide information about signals on the adjacent channel. The periodical tuning to an adjacent channel may comprise to cause the main receiver to scan adjacent channels for signals that may cause reciprocal mixing. The periodical tuning to an adjacent channel may comprise to cause the main receiver to check a wide bandwidth for signals that may cause reciprocal mixing, wherein the wide bandwidth covers the adjacent channels that may cause reciprocal mixing.

The estimation of the tolerable phase noise power level may include a determination by the radio receiver based on what carrier to interference relation that is known to be accepted at the input of a detector of the radio receiver.

The determination of whether the current operation of the radio receiver is satisfactory in sense of a currently provided frequency generation quality may include a measurement by the radio receiver of potential adjacent interference to see if interference has appeared or increased so that a higher frequency generation quality is to be selected, or to see whether the interference has disappeared or decreased so that a lower frequency generation quality is to be selected. The measurement may be performed periodically. The measurement may be performed when an event has occurred. The event may include any one of when a quality of the wake-up signal is found to be poor, and if no WUS has been received for a long time. The measurement of potential adjacent interference from an adjacent channel may comprise to scan adjacent channels for signals that may cause reciprocal mixing. The measurement of potential adjacent interference from an adjacent channel may comprise to cause the radio receiver to check a wide bandwidth for signals that may cause reciprocal mixing, wherein the wide bandwidth covers the adjacent channels that may cause reciprocal mixing.

The frequency generation quality may include phase noise level and/or frequency accuracy.

Thus, the measurement may be performed by the radio receiver and/or be performed by the radio receiver causing a main receiver in a radio arrangement to perform the measurement, and the measurement, by either of the entities, may be performed simultaneously over a wide bandwidth covering the adjacent channels, or be performed time divided by scanning the adjacent channels.

According to a second aspect, there is provided a radio arrangement including a wake-up receiver according to the first aspect and a main receiver arranged to interact with the wake-up receiver.

According to a third aspect, there is provided a method of a radio receiver comprising a local oscillator arrangement arranged to provide a signal for down-conversion of radio frequency signal to an intermediate frequency or a baseband frequency in the radio receiver, and the local oscillator arrangement is capable of selectably providing multiple frequency generation qualities. The method comprises estimating a tolerable frequency generation quality for the current operation of the radio receiver or determining whether the current operation of the radio receiver is satisfactory in sense of a currently provided frequency generation quality such that a frequency generation quality for the local oscillator arrangement can be selected based on the estimation or determination, and adjusting the frequency generation quality of the local oscillator arrangement according to the selection.

The local oscillator arrangement may comprise multiple local oscillator generation circuits, where the selecting of one of the multiple frequency generation qualities includes selecting one of the local oscillator generation circuits. Each of the local oscillator generation circuits may be associated with a power consumption for the respective selected frequency generation quality. A local oscillator generation circuit of the local oscillator arrangement may be capable of selectably providing multiple frequency generation qualities by applying selectable circuit configuration for the local oscillator generation circuit. The selectable circuit configuration may comprise selectable operation parameters and/or selectable circuit parameters for the local oscillator generation circuit. The selectable operating parameters may comprise biasing of the local oscillator generation circuit. The selectable circuit parameters may comprise selectable impedances and/or selectable active circuit elements. The selectable impedances may comprise selectable inductors and/or selectable capacitors which are selectably connectable to the local oscillator generation circuit. The selectable active circuit elements may comprise selectable transistors or selectable amplifiers which are selectably connectable to the local oscillator generation circuit. At least one of the multiple local oscillator generation circuits may be capable of selectably providing multiple frequency generation qualities.

The radio receiver may be arranged to operate as a wake-up radio receiver for a main receiver interacting with the radio receiver. The estimating of the tolerable frequency generation quality may include receiving an indication from the main receiver with information about an interfering signal in an adjacent radio channel. The estimating may include periodically causing the main receiver to tune to an adjacent channel that may cause reciprocal mixing and to provide information about signals on the adjacent channel. The periodical tuning to an adjacent channel may comprise causing the main receiver to scan adjacent channels for signals that may cause reciprocal mixing. The periodical tuning to an adjacent channel may comprise causing the main receiver to check a wide bandwidth for signals that may cause reciprocal mixing, wherein the wide bandwidth covers the adjacent channels that may cause reciprocal mixing.

The estimating of the tolerable phase noise power level may include determining what carrier to interference relation that is known to be accepted at the input of a detector of the radio receiver.

The determining of whether the current operation of the radio receiver is satisfactory in sense of a currently provided frequency generation quality may include scanning for potential adjacent interference to see if interference has appeared or increased so that a higher frequency generation quality is to be selected, or to see whether the interference has disappeared or decreased so that a lower frequency generation quality is to be selected. The scanning may be performed periodically. The scanning may be performed when an event has occurred. The event may include any one of when a quality of the wake-up signal is found to be poor, and if no wake-up signal has been received for a long time. The measuring of potential adjacent interference from an adjacent channel may comprise scanning adjacent channels for signals that may cause reciprocal mixing. The measuring of potential adjacent interference from an adjacent channel may comprise causing the radio receiver to check a wide bandwidth for signals that may cause reciprocal mixing, wherein the wide bandwidth covers the adjacent channels that may cause reciprocal mixing.

The frequency generation quality may include phase noise level and/or frequency accuracy.

According to a fourth aspect, there is provided a computer program comprising instructions which, when executed on a processor of a controller of a radio receiver, causes the radio receiver to perform the method according to the third aspect.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
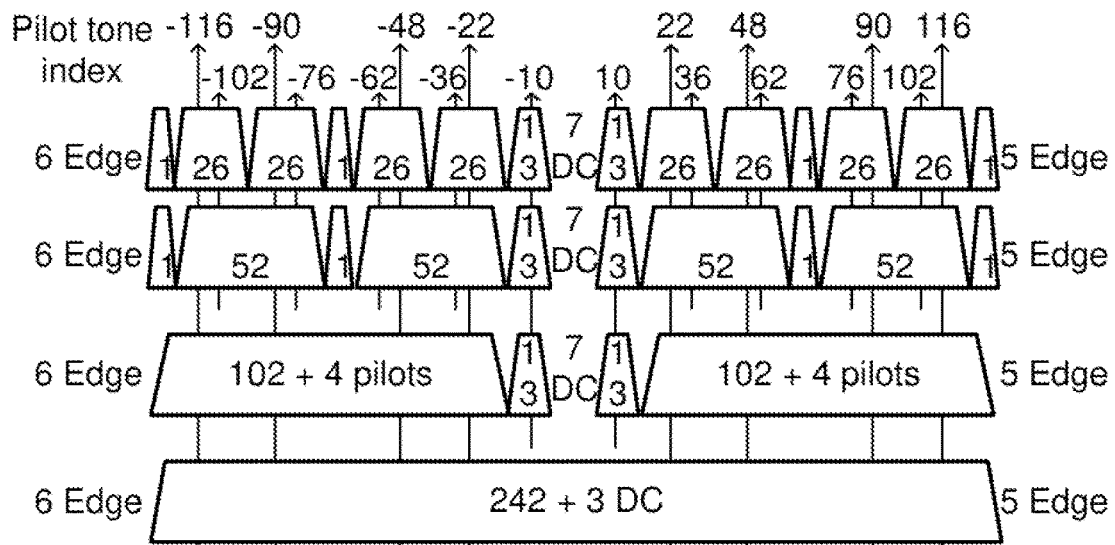
FIG. 1 schematically illustrates how different resource units can be shared between multiple users according to an exemplary communication system.

In brief, the approach disclosed below can be seen to start, from a perspective of an inventive process, with estimating what frequency generation quality can be tolerated without having any noticeable negative impact on the WUR performance. Whether reciprocal mixing is a problem or not depends on what carrier-to-interference ratio (C/I) is required at the input of the detector of the WUR, the power of the received signal, the power of the ACI, and power of the phase noise in the frequency range that causes reciprocal mixing. Further, whether ACI can be filtered out may depend on the frequency generation quality, and whether ACI needs to be filtered out depends on the level of the ACI. Frequency generation quality may include phase noise level and/or frequency accuracy.

When an acceptable frequency generation quality has been estimated, it can be adapted such that the WUR performance target is met. Since it is an estimation, a margin, preferably small, may be applied to ensure proper performance, keeping in mind to still keep the power consumption of the WUR low. The frequency generation quality is adapted in a suitable way, for example by using two or more LO generation circuits with different properties, and select which one to use depending on the requirements, or by changing the characteristics of a single LO generation circuit, e.g. spending different amounts of energy to keep phase noise and/or frequency accuracy within desired bounds, or possibly a combination thereof.

The invention allows for keeping the power consumption of a WUR at a low level without sacrificing the ACI performance in a noticeable way. One consequence of this is that a WUR may use very relaxed LO generation to save power under the vast majority of operation time.

Design of local oscillator generation circuit building blocks like oscillators, frequency multipliers and dividers involves trade-offs between power consumption and frequency generation quality. For example, two types of low cost, energy efficient oscillators traditionally considered appropriate for WUR's are ring oscillators and resistor-capacitor (RC) relaxation oscillators. For these, the power spectrum density of the phase noise is normally inversely proportional to the power consumption. Roughly speaking, this means that frequency generation having low power consumption implies high levels of phase noise, and vice-versa.

The frequency accuracy is normally characterized and measured in terms of the normalized frequency deviation, and the phase noise is normally characterized and measured in terms of the single sideband phase noise spectral density, usually given as $\mathcal{L}(f)$. These quantities are for example defined in "1139-2008—IEEE Standard Definitions of Physical Quantities for Fundamental Frequency and Time Metrology—Random Instabilities", which is a document provided by IEEE Standards Association. The phase noise level is computed by integrating the single sideband phase noise spectral density over a frequency band of interest. A frequency band of interest may be, for example, a frequency interval over which an adjacent interferer can be expected.

The invention will be presented below as being applied to a specific system with specific parameters for the sake of easier understanding of the invention. As would be obvious for anyone of ordinary skill in the art when understanding the invention as demonstrated for the system and parameters below, the approach presented here are easily understood as applicable for and easily adopted to other systems with potentially very different parameters.

Suppose that the considered system is based on IEEE 802.11ax, and operates in the 2.4 GHz ISM band. Moreover, suppose that the channel bandwidth used is 20 MHz. In IEEE 802.11ax, orthogonal frequency division multiple access (OFDMA) may be used by an access point (AP) to transmit to several users concurrently in the downlink (DL) and to receive from several users concurrently in the uplink (UL). FIG. 1 shows various ways for how the bandwidth in a 20 MHz channel may be divided among users. A user can here only be allocated to one resource unit (RU), but the size of the RU may be 26, 52, 106, or 242 sub-carriers. The options for sharing the channel between users are the same for both the DL and the UL.

Although IEEE 802.11ax addresses the need for better multi-user support, it does not really address the need for very low power consumption, which may limit its usefulness for use cases when the transceiver would have to be powered by e.g. a coin cell battery. To address the power consumption issue, work is ongoing in IEEE 802.11 to standardize an amendment for supporting wake-up radio within IEEE 802.11. This amendment is developed by the IEEE 802.11ba task group (TG).

In IEEE 802.11 standards, like IEEE 802.11b, g, n, ac and ax, the channel access is to a large extent distributed among the stations (STAs), rather than scheduled by the AP, although IEEE 802.11ax goes towards being more scheduled in order to support multi-user transmission. The distributed channel access in IEEE 802.11 is based on carrier sense multiple access with collision avoidance (CSMA/CA). CSMA/CA is a listen before talk (LBT) scheme, where an STA which has a packet to send first senses the channel to determine whether the channel is idle or busy. If the channel is determined to be idle, the STA transmits the packet, whereas if the channel is determined to be busy, the transmission is deferred and a new attempt to transmit the packet is made at a later time. The receiver power threshold where the channel is determined to change from idle to busy will determine how aggressively an STA is trying to grab the channel, and is a very important design parameter for a system based on CSMA/CA. Essentially, if the threshold is set low so that the channel is determined to be busy already at a very low receiver power, say −82 dBm, then there is a risk that an STA defers from transmitting although a transmission would have been successful and without actually causing any problem for any other ongoing transmission. The problem with deferring from transmitting when actually not needed is commonly referred to as the "exposed node problem". On the other hand, if the threshold is set too high so that the channel is determined to be idle although there is an ongoing transmission, the generated interference may ruin the performance of the other link, and in addition the transmission itself may not be successful either. This is commonly referred to as a "hidden node problem". Setting the threshold too high effectively means that a transmission from another node is not detected and thus this node will be hidden.

In IEEE 802.11, the CSMA/CA and the determination of whether the channel is busy or idle is based a combination of preamble detect and energy detect. An STA that performs CSMA/CA will declare the channel as being busy if the preamble of an IEEE 802.11 packet is detected at a power of −82 dBm or higher, or if any signal is detected at a power of −62 dBm or higher. If neither of these conditions is met, the channel is declared as idle. So, an IEEE 802.11 STA is 20 dB "nicer" to another IEEE 802.11 STA using a certain preamble than it is to another kind of transmission.

A WUS intended for a WUR would typically look very different than an ordinary IEEE 802.11 signal carrying data. Specifically, the preamble discussed above being used for preamble detect and ensuring that other STAs will defer already at a received power level of −82 dB is transmitted over a 20 MHz wide channel, with the actual bandwidth of the signal being roughly 16 MHz wide. The WUS, on the other hand, can be expected to be considerably less, say only 4 MHz wide. As a consequence, other STAs would rely on energy detect to detect a WUS, thus only declaring the channel as being busy if the WUS is received at a power level of −62 dBm or higher.

Figure 2:
FIG. 2 illustrates how a wake-up signal can be protected by first sending a legacy preamble which can be used by other stations for preamble detection.

To protect the WUS better, and make sure that other STAs defer from transmission when the receiver power is −82 dBm or above, rather than −62 dBm or above, it has been suggested to pre-append the WUS with a legacy preamble as illustrated in FIG. 2. Upon detecting the legacy preamble, an STA will also be able to determine the duration of the packet following the legacy preamble and in that way properly defer from transmitting during the WUS.

This whole approach is thus very similar to how things work for ordinary data transmission.

Figure 3:
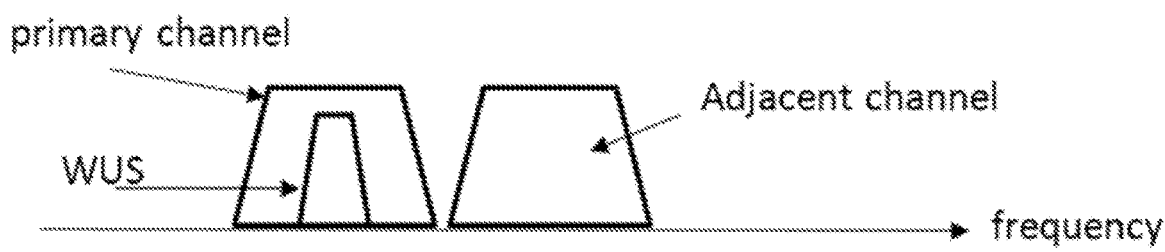
FIG. 3 illustrates how a wake-up signal is transmitted in one channel on which a radio receiver operates and presence of an adjacent channel.

The idea with CSMA/CA is concerned with making sure that STAs using the same channel will not interfere with an ongoing transmission. For STAs using adjacent channels, it is expected that the filtering will ensure that these will not interfere, and therefore, effectively, a STA using an adjacent channel will not perform CSMA/CA for the primary channel, as illustrated in FIG. 3.

Conversely, there is no reason why an STA using an adjacent should defer from transmitting as the transmission will not cause a problem for an STAs using the primary channel.

When instead a WUR is used, rather than the main receiver, the problem is that an STA using an adjacent channel will still not defer, but a WUR may actually be interfered although the WUS is transmitted in the primary channel and the interference is on the adjacent channel.

Thus, there may be a situation where interference on an adjacent channel may actually ruin the performance of a WUR, although the main receiver may work perfectly. We will next describe why this may be the case and also disclose a number of different ways to address this problem.

Figure 4:
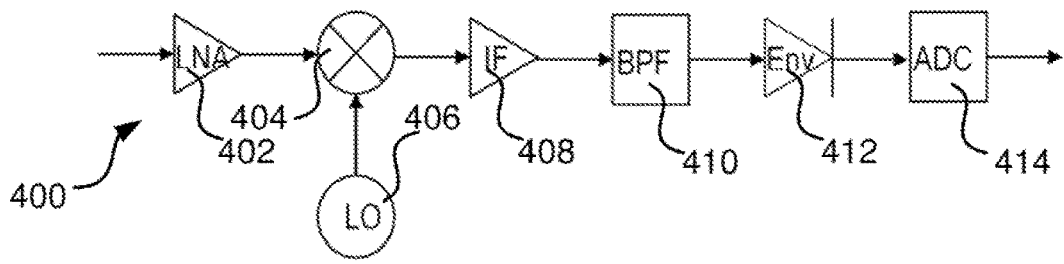
FIG. 4 schematically illustrates a radio receiver architecture.

Consider a WUR architecture 400 as illustrated in FIG. 4. The received signal is amplified in a low noise amplifier (LNA) 402 and then down-converted from the radio frequency (e.g. around 2.4 GHz) to an intermediate frequency (IF) at, say, 10 MHz, by a mixer 404. The IF signal may then be further amplified by an IF amplifier 408 and filtered through a bandpass filter (BPF) 410 centred around IF. In a standard receiver, the bandwidth of the BPF 410 is approximately equal to the bandwidth of the desired signal such that potentially interfering signals in adjacent channels are attenuated by the BPF 410. However, to allow for a bandwidth of the BPF 410 that is roughly the same as the bandwidth of the desired signal, it is required that the frequency generated by the local-oscillator (LO) 406 is very accurate, because otherwise there is a risk that a non-negligible part of the energy of the WUS will be filtered out, which impacts negatively the performance of the WUR.

After the BPF 410, the signal is demodulated using an envelope detector 412, converted to a digital stream by means of an analog-to-digital converter (ADC) 414, and then processed digitally. Typically, the digital processing involves e.g. time estimation by means of correlating the received signal with a known synchronization sequence.

Although the architecture illustrated in FIG. 4 is largely operating in the analog domain, e.g. the envelope detector 412 is before the ADC 414, it is possible to instead perform a larger part of the receiver processing in the digital domain. E.g. additional filtering and the envelope detector 412 may be implemented in the digital domain.

Figure 5:
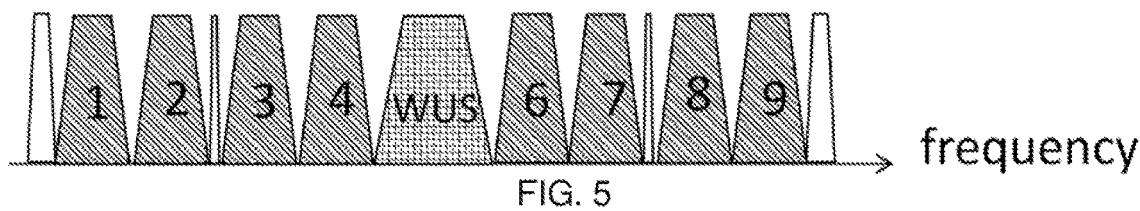
FIG. 5 illustrates transmission of a wake-up signal in a centre resource unit concurrently with data in adjacent resource units.

Now, the present invention is applicable irrespective of whether the envelope detector is implemented in the analog or digital domain, and it does also not depend on implementation details related to exactly how the envelope detector is implemented. Instead, the invention is concerned with potential issues due to phase noise in the LO and the ability to filter out adjacent channel interference, as illustrated in FIG. 3. The purposes of the BPF before the envelope detector is thus to filter out adjacent channels, but it may not have to filter out data transmitted concurrently with WUS using e.g. OFDMA, as illustrated in FIG. 5.

The reason why the BPF does not need to filter the data sent in the same channel as the WUS is that both the data and the WUS in this case are transmitted from the same transmitter, and then it is possible to control the relative strength of these signals and by that ensure that the envelope detector will work properly. For ACI, the situation is completely different since the ACI originates from another transmitter, and thus this is not under control and may also be significantly stronger than the signal to receive in the primary channel.

The LO generation may consume a significant part of the total power of the WUR. In order to reduce the LO power consumption, the requirements of the LO are very relaxed, both concerning the accuracy of the centre frequency of the LO and its purity, i.e., the phase noise of the LO. The relaxed frequency accuracy of the LO is to some extent addressed by allowing a bandwidth of the BPF which is considerably larger than the BW of the WUS itself. However, the effect of phase noise is not, and is in fact worsened because of the relatively wide BPF.

With respect to the frequency inaccuracy, suppose that the inaccuracy would be as much as half the channel bandwidth, so 10 MHz for a 20 MHz Wi-Fi channel. Then the bandwidth of the BPF would have to be 20 MHz+the bandwidth of the WUS to ensure that the WUS would actually be in the passband of the filter. However, if a filter that is more than 20 MHz wide is selected and in addition there is a 10 MHz frequency error, it is easy to see that an adjacent channel interferer will not be properly filtered out. Thus, if there in fact is an interfering signal of significant strength on an adjacent channel, one may need to ensure that the frequency accuracy is good enough so that a more narrow filter can be employed. For the example above, a +−5 MHz frequency inaccuracy combined with a 10 MHz BPF would be a suitable combination. Now, in many situations there may not be any adjacent interferer present, in which case one may use a frequency generation which has very relaxed requirements, e.g. low frequency accuracy.

When an LO signal is not a perfectly noiseless sinusoid, but also contain other frequency components, the result is that not only the desired signal will be down-converted to the desired IF, but also adjacent channels may fall on the same IF. This is commonly known as reciprocal mixing in the literature.

The power of the interference caused by reciprocal mixing can be approximated as $$I = P_{adj} + P_{PN} + BW$$

Where $P_{adj}$ is the receiver power of the adjacent interference, $P_{PN}$ is the power spectrum density of the phase noise (assumed flat over the bandwidth BW), and BW is the bandwidth of the BPF before the envelope detector. All numbers are here in dB and dBm.

Since what usually matters is the signal-to-interference ratio (C/I) at the input of the detector, it is convenient to relate the phase noise to the power of the carrier, e.g. −115 dBc/Hz. As an example, suppose that the BW is 10 MHz, then $BW + P_{PN} = -45$ dBc.

Moreover, suppose that the C/I at the input of the detector should be at least 0 dB. This means that the C/I at the input to the mixer must not be lower than −45 dB. If e.g. the desired signal, C, is received at −90 dBm, the interference in the adjacent channel must not be received at a power of −45 dBm or more. Since a Wi-Fi transmitter typically would use at least 15 dBm output power, this would correspond to a pathloss of 60 dB or more in order for the WUR not to be interfered such that the performance would be significantly degraded.

If in fact the interference power received on the adjacent channel would be higher, the WUR would consequently not work properly. It is of course possible to counteract this problem by making sure that the phase noise is on a sufficiently low level. Say that one would require that the WUR should be able to operate also when the interference power is at −25 dBm (corresponding to a path loss of 40 dB, which in the 2.4 GHz ISM band roughly equals 1 meter distance from the interferer). One would then design the LO such that the integrated phase noise would not exceed −65 dBc. The problem with this approach is that generating this LO signal would consume more power, and the only time this would actually be needed would be when the WUR is located at a distance to an interferer as close as 1 meter.

According to an embodiment, the phase noise of the LO signal used for down-converting the received signal is adjusted by having two or more LO generation circuits available and select which one to use for down-conversion based on the requirement to handle ACI, such that an LO generation circuit requiring more power is used when it is determined that the requirements on handling ACI is high. For example, when the estimated ACI power exceeds a predetermined threshold a first LO generation circuit is chosen. Otherwise a second LO generation circuit is chosen. The first LO generation circuit has higher power consumption than the second LO generation circuit.

According to an embodiment, the phase noise of the LO signal used for down-converting the received signal is adjusted, varying the power consumption of the LO generation circuit based on the requirement to handle ACI, presuming that the increase of power implies lower phase noise for the type of LO generation circuit used, such that more power is used when it is determined that the requirements on handling ACI is high. For example, when the estimated ACI power exceeds a predetermined threshold a first set of parameter values for the LO generation circuit is used. Otherwise a second set of parameter values for the LO generation circuit is used. The LO generation circuit has higher power consumption when the first set of values is used. Parameters could for example be some of a resistance, capacitance, inductance, current, etc. This is thus applicable when the LO generation circuit has adjustable phase noise characteristics.

According to an embodiment, the main receiver is used to determine whether there is an interfering signal in an adjacent channel and, if so, estimate the received power. This may for instance be done by periodically tune the main receiver to the adjacent channels that may cause problems due to reciprocal mixing in case there is a strong interfering signal and measure e.g. signal strength. Here, information about the interfering signal may also be acquired from an external node, e.g. an access point or base station of the communication network, by the main receiver.

According to an embodiment, the WUR itself will determine whether there is an interfering signal in an adjacent channel and if so estimate the received power. This may for instance be done by periodically tune the WUR to the adjacent channels that may cause problem due to lack of filtering or reciprocal mixing in case there is a strong interfering signal. Whereas the WUR typically detects the presence of a WUS by correlation in the digital domain, the detection of strong adjacent interference would typically be performed by just estimating the received power in the analog domain. This is feasible as the power level of an interfering signal that potentially can cause harm will be, say, 30-40 dB stronger than the power of a WUS to be detected. For example, the presence and power of adjacent interference is detected by changing the frequency of the LO to measure on the channel of interest, or the presence and power of adjacent interference is detected by increasing the bandwidth of the BPF to detect whether there is any signal.

According to this embodiment, the AP scans adjacent channels and indicates to the STA the ACI level. This can be done e.g. through a management frame. This can be useful in isolated environments (e.g. mines or shielded industrial environments) where the AP can determine whether adjacent channels are used at all. This saves energy at the STA since it needs not to scan adjacent channels.

The embodiments above may be combined in any way. For example, the embodiment where phase noise characteristics are adjusted for one LO generation circuit, this may be combined with selecting another LO generation circuit, for example when enough adjustment is not feasible, or when adjustment of the one LO generation circuit emanates in worse performance to power relation than selecting another LO generation circuit.

The choice of a suitable phase noise power level may be determined based on what C/I can be accepted at the input of the detector, which in turn may depend on exact details for how the WUR is implemented.

For example, the required C/I is based on what C/I is required for co-channel interference. Since the required C/I for co-channel interference easily can be determined e.g. by means of simulation this may be used as target also when the interference originates from an adjacent channel. In another example, the required C/I takes into account that the interference may be bursty, such that potential impact on reception is considered. That is, there is a possibility that the WUR is based on the assumption that the total interference is relatively constant throughout the reception of the entire packet e.g. because a decision threshold has to be set based on this. In this case, the WUR may be able to operate at relatively small C/I, say 0 dB, but a relative small change of the interference may still cause a problem. If this is the case, the C/I is selected such that the receiver is able to operate if the interference conditions alters between the interference being absent to the interfering being present at a maximum allowed level.

The potential presence of adjacent channel interference that potentially may cause problem due to reciprocal mixing is expected to in most cases to be static, or very slowly changing. If for instance the WUR would be implemented in a sensor that would be permanently mounted, the presence of strong adjacent interference may simply depend on if the sensor happens to be placed near an access point which is using an adjacent channel. If this is the case, the more stringent phase noise requirement would likely apply for the entire time of operation for sensor, whereas if not it may never apply.

If the WUR would be placed in a laptop, a new scenario would be present every time the lap-top is moved, which e.g. may be a few times per day.

In one embodiment, scanning for potential adjacent interference is done on a regular basis, say once every hour or once every day. This periodic scanning may be performed both when the WUR is using the relaxed LO, in which case the scanning essentially is to see if interference has appeared so that the more stringent LO settings are needed, or when the LO is using the more stringent setting, in which case the scanning is performed to see whether the interference has disappeared so that the more relaxed LO settings may be used instead.

In an embodiment, primarily applicable when the WUR is in the state where the more relaxed LO performance is used, the scanning is performed upon need. Specifically, if the quality of the WUS is found to be poor or if no WUS has been received for a long time, the WUR may decide that a potential interferer at an adjacent channel may be present and may therefore decide to perform a scan. The WUR may in this case also skip the scan, and just change to the more accurate LO performance to monitor whether the performance improves.

Figure 6:
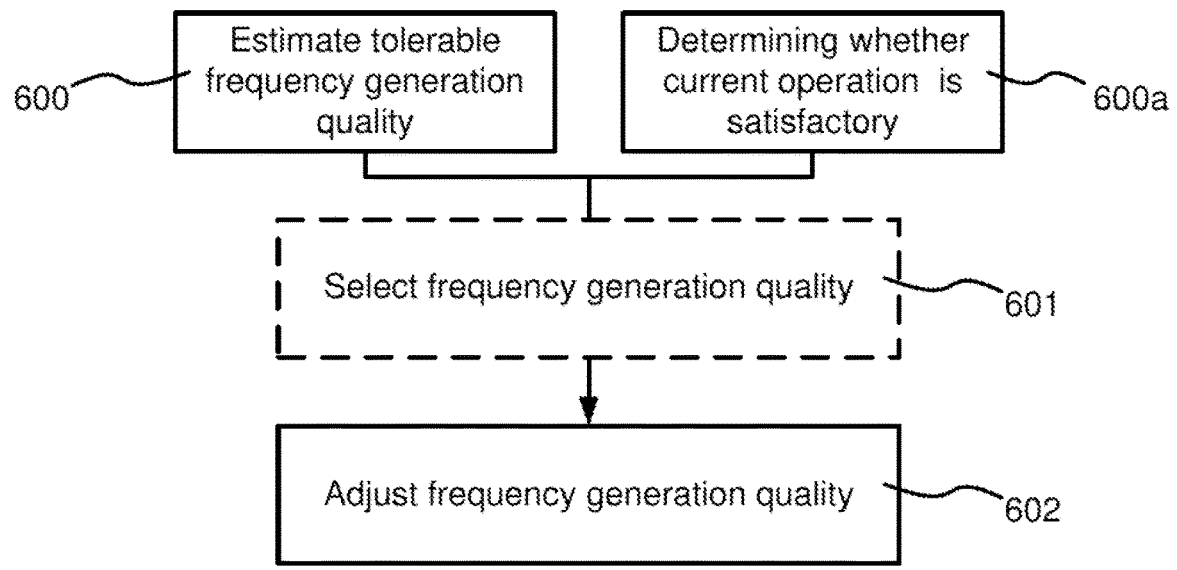
FIG. 6 is a flow chart illustrating a method according to an embodiment.

FIG. 6 is a flow chart schematically illustrating a method according to an embodiment. The method is applicable to a radio receiver comprising a local oscillator arrangement arranged to provide a frequency for down-conversion of radio frequency signal to an intermediate frequency or a baseband frequency in the radio receiver. The local oscillator arrangement is presumed to be capable of selectably providing multiple frequency generation qualities, where the respective frequency generation quality emanates in more or less power consumption, as discussed above. The method comprises estimating 600 a tolerable frequency generation quality for the current operation of the radio receiver or determining 600a whether the current operation of the radio receiver is satisfactory in sense of a currently provided frequency generation quality. The method thus enables selecting 601 a frequency generation quality for the local oscillator arrangement based on the estimation or determination. The selection 601 may include comparing the estimated 600 and/or determined 600a values with one or more thresholds wherein the tolerable frequency generation quality for example may be given from a look-up table based on which threshold is reached. Based on the selection, the method includes adjusting 602 the frequency generation quality of the local oscillator arrangement according to the selection.

Figure 7:
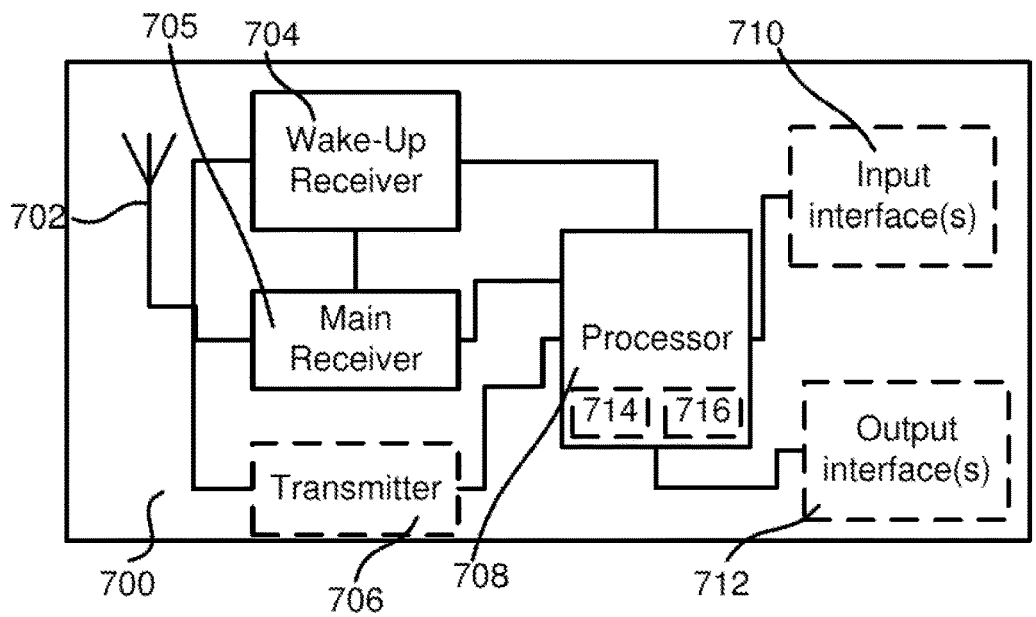
FIG. 7 is a block diagram schematically illustrating a radio arrangement according to an embodiment.

FIG. 7 is a block diagram schematically illustrating a radio arrangement 700 according to an embodiment. The radio arrangement comprises an antenna arrangement 702, a wake-up receiver 704 and a main receiver 705 connected to the antenna arrangement 702, an optional transmitter 706 connected to the antenna arrangement 702, a processing element 708 which may comprise one or more circuits, one or more input interfaces 710 and one or more output interfaces 712. The interfaces 710, 712 can be user interfaces and/or signal interfaces, e.g. electrical or optical. The radio arrangement 700 may be arranged to operate in a communication network, e.g. a wireless local area network or a cellular communication network. In particular, by the processing element 708 being arranged to perform the embodiments demonstrated with reference to FIGS. 1 to 6, the radio arrangement 700 is capable of keeping low power consumption and dealing with interferers as elucidated above. Thus, the processing element 708 here also functionally illustrates the controller of the wake-up radio. The processing element 708 can also fulfill a multitude of tasks, ranging from signal processing to enable reception and transmission since it is connected to the wake-up receiver 704, the main receiver 705 and the optional transmitter 706, and also be included in executing applications, controlling the interfaces 710, 712, etc.

The processing element 708 comprises or is connected to a memory 714, and comprises one of more processing circuits 716.

Figure 8:
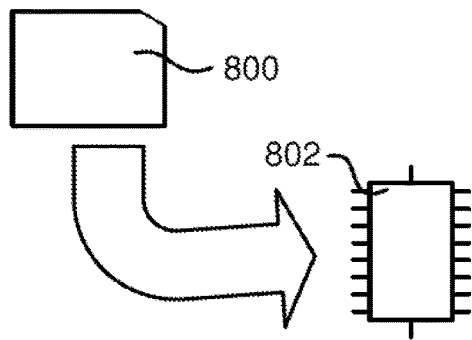
FIG. 8 schematically illustrates a computer-readable medium and a processing device.

The methods according to the present invention is suitable for implementation with aid of processing means, such as computers and/or processors, especially for the case where the processing element 708 demonstrated above comprises a processor handling controlling of the radio resources, and the wake-up radio in particular. Therefore, there is provided computer programs, comprising instructions arranged to cause the processing means, processor, or computer to perform the steps of any of the methods according to any of the embodiments described with reference to FIG. 1 to 6. The computer program preferably comprises program code which is stored on a computer readable medium 800, as illustrated in FIG. 8, which can be loaded and executed by a processing means, processor, or computer 802 to cause it to perform the methods, respectively, according to embodiments of the present invention, preferably as any of the embodiments described with reference to FIGS. 1 to 6. The computer 802 and computer program product 800 can be arranged to execute the program code sequentially where actions of the any of the methods are performed stepwise. The processing means, processor, or computer 802 is preferably what normally is referred to as an embedded system. Thus, the depicted computer readable medium 800 and computer 802 in FIG. 8 should be construed to be for illustrative purposes only to provide understanding of the principle, and not to be construed as any direct illustration of the elements.

The invention claimed is:

1. A radio receiver arranged to operate as a wakeup receiver for a main receiver interacting with the radio receiver, the radio receiver comprising:
   a local oscillator arrangement, the local oscillator arrangement being configured to provide a signal for down-conversion of a radio frequency signal to one of an intermediate frequency and a baseband frequency in the radio receiver, and the local oscillator arrangement being configured to selectively provide multiple frequency generation qualities; and
   a controller, the controller being configured to select a frequency generation quality of the provided multiple frequency generation qualities based at least in part on an estimated adjacent channel interference power.

2. The radio receiver of claim 1, wherein the controller is further configured to periodically cause the main receiver to tune to an adjacent channel that may cause reciprocal mixing and to provide information about signals on the adjacent channel.

3. The radio receiver of claim 2, wherein the periodic tuning to an adjacent channel comprises causing the main receiver to scan adjacent channels for signals that may cause reciprocal mixing.

4. The radio receiver of claim 2, wherein the periodic tuning to an adjacent channel comprises causing the main receiver to check a wide bandwidth for signals that may cause reciprocal mixing, wherein the wide bandwidth covers the adjacent channels that may cause reciprocal mixing.

5. The radio receiver of claim 1, wherein the local oscillator arrangement comprises multiple local oscillator generation circuits where the selection of a frequency generation quality includes selection of one of the local oscillator generation circuits.

6. The radio receiver of claim 5, wherein each of the local oscillator generation circuits are associated with a power consumption for a respective selected frequency generation quality.

7. The radio receiver of claim 1, wherein the local oscillator arrangement is capable of selectably providing multiple frequency generation qualities by selecting a local oscillator generation circuit of the local oscillator arrangement.

8. The radio receiver of claim 7, wherein selecting a local oscillator generation circuit comprises selecting selectable operation parameters and selectable circuit parameters for the local oscillator generation circuit.

9. The radio receiver of claim 8, wherein the selectable operating parameters comprise biasing of the local oscillator generation circuit.

10. The radio receiver of claim 8, wherein the selectable circuit parameters comprise any of selectable impedances and selectable active circuit elements.

11. A method of a radio receiver comprising a local oscillator arrangement configured to provide a signal for down-conversion of a radio frequency signal to one of an intermediate frequency and a baseband frequency in the radio receiver, the local oscillator arrangement being configured to provide multiple frequency generation qualities, the method comprising:
selecting a frequency generation quality of the provided multiple frequency generation qualities based at least in part on an estimated adjacent channel interference power; and
adjusting the frequency generation quality of the local oscillator arrangement according to the selection.

12. The method of claim 11, further comprising periodically causing a main receiver to tune to an adjacent channel that may cause reciprocal mixing and to provide information about signals on the adjacent channel.

13. The method of claim 12, wherein the periodic tuning to an adjacent channel comprises causing the main receiver to scan adjacent channels for signals that may cause reciprocal mixing.

14. The method of claim 12, wherein the periodic tuning to an adjacent channel comprises causing the main receiver to check a wide bandwidth for signals that may cause reciprocal mixing, wherein the wide bandwidth covers the adjacent channels that may cause reciprocal mixing.

15. The method of claim 11, wherein the local oscillator arrangement comprises multiple local oscillator generation circuits where the selection of the frequency generation quality includes selection of one of the local oscillator generation circuits.

16. The method of claim 15, wherein each of the local oscillator generation circuits are associated with a power consumption for a respective selected frequency generation quality.

17. The method of claim 11, wherein the local oscillator arrangement is capable of selectably providing multiple frequency generation qualities by selecting a local oscillator generation circuit of the local oscillator arrangement.

18. The method of claim 17, wherein selecting a local oscillator generation circuit comprises selecting selectable operating parameters and selectable circuit parameters for the local oscillator generation circuit.

19. The method of claim 18, wherein the selectable operating parameters comprise biasing of the local oscillator generation circuit.

20. The method of claim 18, wherein the selectable circuit parameters comprise any of selectable impedances and selectable active circuit elements.

21. A computer-readable medium storing a computer program comprising instructions which, when executed on a processor of a controller of a radio receiver comprising a local oscillator arrangement configured to provide a signal for down-conversion of radio frequency signal to one of an intermediate frequency and a baseband frequency in the radio receiver, the local oscillator arrangement being configured to provide multiple frequency generation qualities, causes the radio receiver to:
select a frequency generation quality of the provided multiple frequency generation qualities based at least in part on an estimated adjacent channel interference power; and
adjust the frequency generation quality of the local oscillator arrangement according to the selection of the frequency generation quality.

* * * * *

UNITED STATES PATENT AND TRADEMARK OFFICE
CERTIFICATE OF CORRECTION

| | |
|---|---|
| PATENT NO. | : 11,394,416 B2 |
| APPLICATION NO. | : 17/178685 |
| DATED | : July 19, 2022 |
| INVENTOR(S) | : Wilhelmsson et al. |

It is certified that error appears in the above-identified patent and that said Letters Patent is hereby corrected as shown below:

In the Specification

In Column 1, Line 8, delete "2019," and insert -- 2019, now U.S. Pat. No. 10,998,928, --, therefor.

In Column 7, Line 26, delete "$\mathcal{L}$ (f)." and insert -- $\mathcal{L}$(f). --, therefor.

In Column 10, Lines 44-45, delete "signal-to-interference ratio (C/I)" and insert
-- signal-to-interference ratio (S/I) --, therefor.

In Column 13, Line 52, delete "one of more" and insert -- one or more --, therefor.

Signed and Sealed this
Fourteenth Day of February, 2023

Katherine Kelly Vidal
*Director of the United States Patent and Trademark Office*